United States Patent [19]

Byers et al.

[11] Patent Number: 4,996,688

[45] Date of Patent: Feb. 26, 1991

[54] FAULT CAPTURE/FAULT INJECTION SYSTEM

[75] Inventors: Larry L. Byers, Apple Valley; Kwisook Tsang, Shoreview; James H. Scheuneman, St. Paul; Penny Svenkeson, Forest Lake, all of Minn.

[73] Assignee: Unisys Corporation, Blue Bell, Pa.

[21] Appl. No.: 246,512

[22] Filed: Sep. 19, 1988

[51] Int. Cl.$^5$ .................... G01R 31/28; G06F 11/00
[52] U.S. Cl. ........................... 371/16.5; 364/200; 371/3
[58] Field of Search .................. 371/3, 16.5, 29.1; 364/200 MS File, 900 MS File

[56] References Cited

U.S. PATENT DOCUMENTS

| | | | |
|---|---|---|---|
| 3,838,260 | 9/1974 | Nelson | 371/16.5 |
| 4,514,846 | 4/1985 | Federico et al. | 371/16.5 |
| 4,539,682 | 9/1985 | Herman et al. | 371/16.5 |
| 4,549,296 | 10/1985 | Castel et al. | 371/16.5 |
| 4,639,917 | 1/1987 | Furuta | 371/16.5 |
| 4,661,953 | 4/1987 | Venkatesh et al. | 371/16.5 |
| 4,669,081 | 5/1987 | Mathews, Jr. et al. | 371/3 |
| 4,759,019 | 7/1988 | Bentley et al. | 371/3 |

Primary Examiner—Charles E. Atkinson
Attorney, Agent, or Firm—Thomas J. Nikolai; Robert S. Bramson; Glenn W. Bowen

[57] ABSTRACT

Apparatus for detecting and isolating the occurrence of faults in a digital electronic system so as to reduce the mean-time-to-repair. Associated with the logic circuitry to be monitored is a fault indicator which produces a fault signal when a malfunction occurs. Fault capture circuitry is arranged in a hierarchical manner and provides a group fault output signal when one of the fault indicators generates a fault signal. A programmable controller is provided which receives the group fault signal as an interrupt and which then responds by transferring registered fault event signals to a dynamic string register, rearming the error detection used to trap a fault signal and logging the fault location in a memory for later readout by a maintenance processor or the like. The dynamic string allows communications to take place using a scan/set protocol.

4 Claims, 4 Drawing Sheets

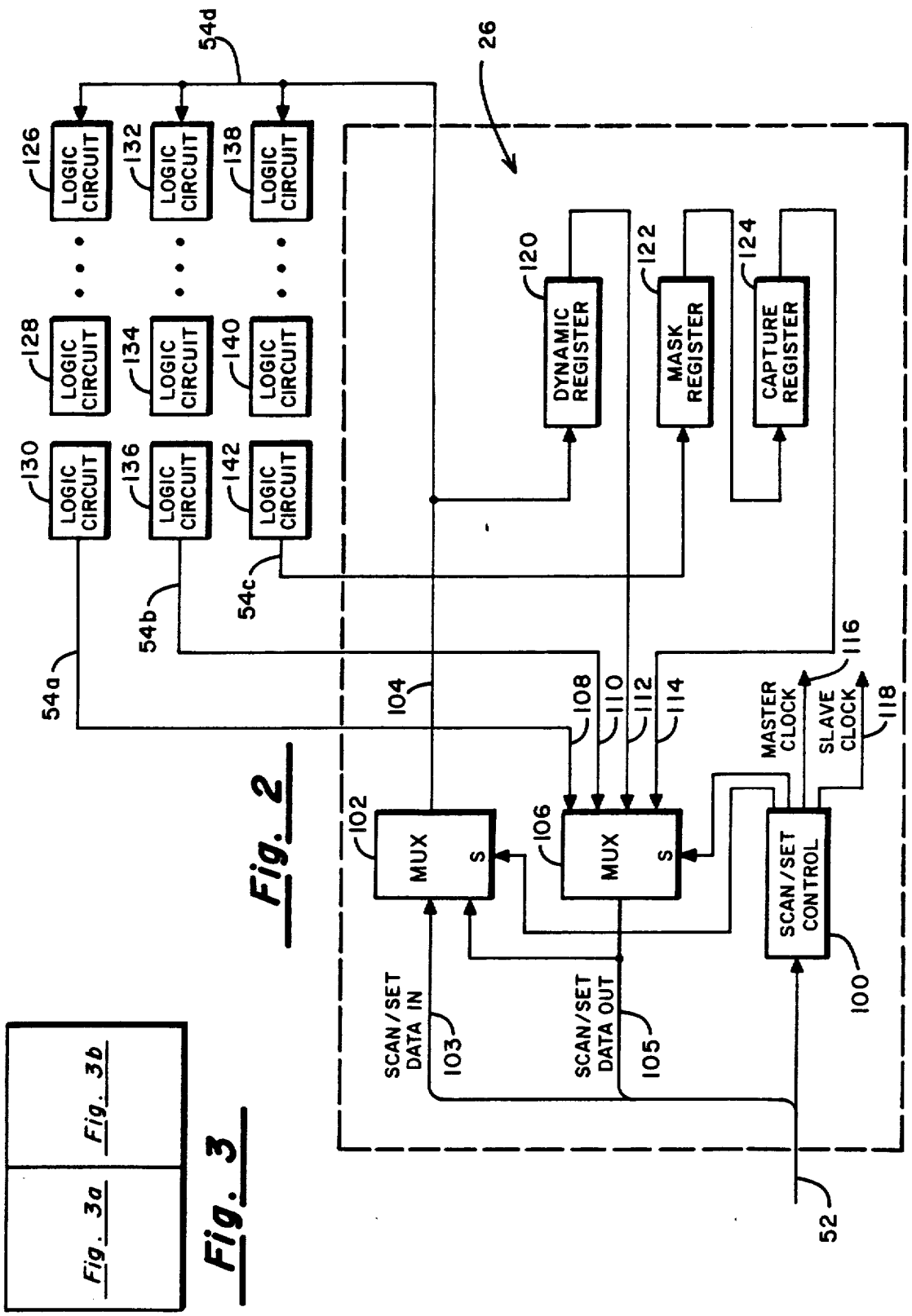

FAULT CAPTURE/FAULT INJECTION SYSTEM

BACKGROUND OF THE INVENTION

I. Field of the Invention

This invention relates generally to an improved method and apparatus for assuring that a digital computing system is operating error free and which provides information sufficient to localize the failed unit for repair in the event of a fault.

II. Discussion of the Prior Art

With the ever increasing complexity of digital computing systems and the also increasing requirements for better system availability and lower mean time to repair, improved techniques for the detection and isolation of logical malfunctions or faults are essential. Various techniques for both fault detection and fault isolation are well known in the art. The earliest of these techniques employed diagnostic test software to assure the operability of the computer system before running an application program. More recently it has become the practice to augment such software with built-in hardware fault detection circuitry such that a fault can be detected the instant it occurs, even while the computer is running an application program. Although this added fault detection hardware improved the confidence of error-free operation, it did not, by itself, improve the confidence of fault isolation. When the computer is running an application program, it can sense only that an error has occurred. The system must be stopped, a diagnostic routine loaded and run to isolate the fault. This can be a very time consuming process, particularly if the fault is of an intermittent nature.

A further improvement has been the addition of fault indicators on each of the replaceable subassemblies, i.e., printed circuit cards. Now when a fault occurred, it would be captured in a latch on the card which produced the fault and the latch would activate the indicator. In theory, all that was required to repair the fault was to replace the card with the lighted fault indicator. In practice, this did not provide good isolation because in addition to the true fault indication other fault indicators would be lit due to propagation of errors from the original fault.

In an ideal fault-capture system, every possible fault which might intermittently occur would be immediately sensed and all of the detailed information required to unambiguously isolate the fault to the lowest repairable assembly would be accumulated before the system was stopped. Further, there would be a corollary fault injection means to assure that all of the fault-capture circuitry was, in fact, operational. It is unlikely that any capture scheme will fully achieve this ideal in that the overhead of additional circuitry with its associated cost and complexity increases substantially as this ideal is approached. However, the instant invention provides a substantial improvement over the prior art in that fault isolation is substantially improved with relatively simple capture circuitry which imposes a minimum overhead penalty.

SUMMARY OF THE INVENTION

The present invention provides a new and improved mechanism for detecting, capturing and reporting faults in logic circuitry such as may be found in digital data processing systems. The mechanism includes a microprocessor-based maintenance controller for overseeing fault-capture and fault-injection using a scan/set protocol. Fault information is logged in a local memory which maintains a history of all faults sensed in a given logic array. A hierachical arrangement of plural fault capture circuits are interposed between the maintenance controller and the individual logic circuits whose performance is being monitored. In this way, an initial fault occurring in one logic circuit will be captured and the failing circuit identified without having succeeding faults propagating as a result of the initial fault being recognized and treated as a malfunction. In this way, fault-isolation is enhanced.

OBJECTS OF THE INVENTION

It is an object of this invention to provide a hierarchical fault reporting system which will indicate the first occurrence of a fault.

It is a further object of this invention to use selective fault masking to distinguish true fault indications from indications due to propagated errors.

It is a further object of this invention to provide detailed data sufficient to isolate the fault to a single removable card assembly without a diagnostic routine loaded.

It is a further object of this invention to capture even more detailed data sufficient to isolate the fault to a single integrated circuit, if necessary, wherein such information can be accessed once the unit has stopped.

DESCRIPTION OF THE DRAWINGS

FIG. 2 is a more detailed block diagram showing the routing and control of scan/set data paths.

DESCRIPTION OF THE PREFERRED EMBODIMENT

Figure 1:
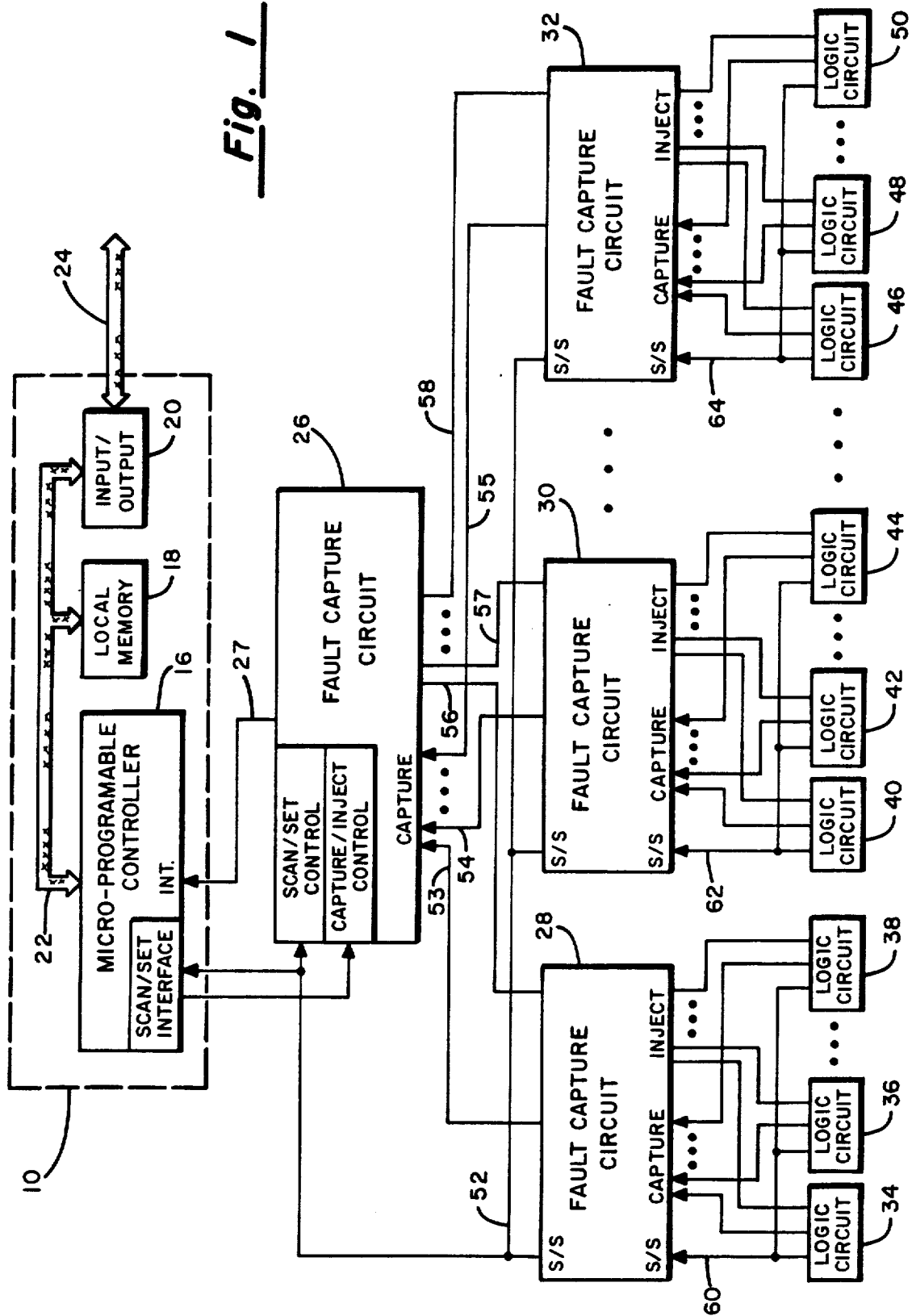
FIG. 1 is a top level system block diagram of the fault-capture/fault-injection, system.

Referring to FIG. 1, maintenance controller lo is a microprogrammable controller which performs all maintenance functions including fault-capture retrieval and fault-injection. It is comprised of a microprogrammable controller 16 which executes a stored program to control the functional elements 12, 14, 18 and 20. Communication between these elements is via conventional data address bus 22. All data communication between the maintenance controller and the fault-capture circuits is by means of a scan/set protocol This is a well-known protocol commonly used for maintenance and diagnostic purposes whereby various internal registers in a computing system may be accessed in a bit-serial mode to both read and write information. A scan/set path which threads through a multiplicity of registers is known as a scan string. A common form of scan/set arrangement is the static string wherein the unit clock must be stopped before the string can be interrogated, via the scan clock. Another well-known form is the dynamic string which contains additional logic gating to enable registers to be read and written with the unit clock running.

For a detailed description of both dynamic and static scan/set techniques reference is made to the Witalka, et al U.S. Pat. No. 4,511,967 which is assigned to applicants' assignee.

The present invention not only makes extensive use of scan/set techniques to accomplish the fault-capture function, but further facilitates, through shared hardware, the transfer of scan/set information between the maintenance controller and the rest of the system. The information is communicated, via the scan/set bus 52 which is comprised of the data-in line, the data-out line plus a set of address lines sufficient to uniquely identify any scan/set string as the object of communication. The fault-capture/fault-injection process is controlled by the maintenance controller, via the capture/inject control 14, which broadcasts an HD LOAD control signal to all fault-capture circuits. For clarity, these signal lines have been omitted from FIG. 1. However, the control functions will be dealt with in the detailed description of the fault-capture circuit, infra.

The maintenance controller 10 employs local memory 18 to log fault information. A record is maintained of the most recent fault, the detailed information associated with that fault and a history of all faults which have been sensed since the last unit reset. Input/output circuit 20 enables the maintenance controller to communicate over data path 24 to any other equipment desired. Typically connections would be to a maintenance console.

Fault capture and fault injection is accomplished with a hierarchical array of fault-capture circuits. In the preferred embodiment shown in FIG. 1, all fault-capture circuits are identical and are comprised of a single integrated circuit. The circuits are arranged in a two-level hierarchy, 24 bits wide. The invention could also be practiced with other arrangements, particularly by changing the number of levels or the width in the hierarchy.

In the preferred embodiment, fault-capture circuit 26 occupies the top level of the hierarchy and is capable of controlling up to 24 fault-capture circuits in the second level of the hierarchy indicated by circuits 28, 30, 32. Fault-capture circuit 28, 30 and 32 control logic circuits 34 through 50, thus providing a capability to capture fault information from up to 576 logic circuits (24×24). For purposes of this description, a logic circuit is defined as a fault-detection circuit, the associated fault-injection circuit and the associated logic circuity covered by the fault-detection circuit. An example of such a logic circuit would be a data register, a circuit which checks parity of the data, and circuitry which forces a parity error in response to a fault inject command. An integrated circuit containing three such parity checkers would be considered as one logic circuit with three separate fault indications.

The fault-capture process proceeds as follows. Consider the case of a fault detected by a parity checking circuit in logic circuit 34. This fault causes a "1" to propagate to bit position one of the 24-bit capture register of fault-capture circuit 28. Since it is desired to capture the first instance of a fault indication, as soon as this fault is sensed, the other inputs to the capture register are temporarily inhibited to avoid accumulating fault indications associated with propagated errors. The output of fault-capture circuit 28 propagates to bit position one of the capture register of circuit 26. Again, as soon as this event is sensed, other inputs of the capture register of circuit 26 are also inhibited. Within two clock cycles of the occurrence of the fault, the output of fault-capture circuit 26 generates an interrupt to the microprogrammable controller 16, via interrupt line 27. Upon sensing the interrupt, the controller 16 causes the scan/control circuitry 12 to broadcast a sequence of control signals to all fault-capture circuits. Upon receiving these control signals, each fault-capture circuit performs an identical sequence which consists of transferring the information contained in the capture register into a register which can be read through scan/set with the clock running, accumulating any bits set in the capture register into a mask register and re-enable the propagation of other faults into their respective bits of the mask and save these bits which are now inhibited by the mask register. Once re-armed, all fault-capture circuits are then alert to any additional fault indications which may be generated. Typically, each fault will first generate a fault indication indicative of where the fault occurred, followed by other fault indications which are the result of error propagation. For example, a failure in logic circuit 34 could cause data to be corrupted such that a parity checker would report that fault. On some later machine cycle, the corrupted data may be passed to logic circuit 40, which although itself fully, functionally detects incorrect parity on the same corrupted data.

With fault capture masking now armed and further fault capture interrupts disabled, the maintenance controller reads the capture information from fault-capture circuit 26 (which identifies which lower circuit), via the scan/set path 52. It then reads all fault capture circuits 26–32, again using the scan/set path 52. This total information is used to determine fault capture circuit 28 and logic circuit 34.

Upon completing the reading of capture data, fault capture interrupts are again enabled and the fault capture circuits are re-armed with the masks maintained. If another fault indication has been sensed, a second interrupt will be generated and the process again repeated until all fault indications associated with a fault episode have been accumulated by the maintenance controller. The fault-capture hierarchy in conjunction with the serial scan/set data transfer mechanism thus provides a very fast and efficient means to accumulate all of the information required to perform fault isolation in virtually every instance without a diagnostic routine loaded. This provides a substantial advantage in reducing mean-time-to-repair, since the fault does not have to be reproduced with fault-diagnostic software and, generally, a repair can be accomplished with the replacement of only the faulty module, whereas other fault isolation schemes may only be able to isolate to one of possibly two or three faulty modules.

Generally, the initial fault indication of the gate array level will provide sufficient information to isolate the fault to a single removable card assembly. However, there are situations in which the isolation additionally requires information about the low level fault. This information is obtained from the unit after it is stopped via the scan/set. This is the static detector level which isolates to the portion of the logic circuit which failed. It is also necessary to provide a means to test the fault-detection and fault-capture circuitry to assure that they are operational. This is done through programmed fault injection initiated by the maintenance controller. In the preferred embodiment, each logic circuit 34 through 50 has associated with its fault detector provisions whereby a fault can be injected. The same hierarchical organization used to tree-in capture information from the logic circuits to the maintenance controller is used to tree-out the fault-injection command from the maintenance controller 10 to a specific logic circuit, although the invention could also be practiced without a one-to-one correspondence between fault injection and fault detection. To inject the fault, the maintenance controller 16 first transmits routing information to the fault-capture circuits by means of the scan/set control circuit. Next, a signal to inject the fault is generated by the scan/control circuitry 12 to the capture inject on line 15. The routing information previously written into the fault-capture circuits provide the unique path for the fault-injection signal to a specific logic circuit. In addition to utilizing the scan/set data path to communicate fault-capture and fault-injection information, the fault-capture circuits 28, 30 and 32 associated with the lowest level of the hierarchy also coordinate the scan/set data transfer between the maintenance controller 10 and the logic circuits 34–50 and any of their subordinate logic circuits. Fault-capture circuits 28 through 32 decode the string address provided on the scan/set control bus 52 and when addressed will route scan/set data to their subordinate logic circuits on data lines 60, 62 and 64, respectively.

FIG. 2 is a more detailed block diagram showing the routing of scan/set paths through fault-capture circuits 26 through 32. Scan/set bus 52 is comprised of a data-in line, a data-out line, an address bus, a read/write line and clock lines and clear lines. Scan/set control logic 100 decodes a field of the scan/set address and when it matches the assigned address of a particular fault-capture circuit, master clock 116 and slave clock 118 are operative to shift the scan/set data. Another field of the scan/set address is decoded to provide the string selection. Consider first the case where data is to be written to a string designated as string A. In this case, multiplexer 106 is selected such that the output 112 corresponds to the scan/set data-in, i.e., the data originating from the maintenance controller. String A corresponds to dynamic register 120 and the string select A line causes data present on line 104 to be shifted into dynamic register 120. To read dynamic register 120, multiplexer 102 is selected such that the output 104 corresponds to the scan/set data-out line 105 to recirculate the data back into register 120. Thus, at the end of a read cycle, a complete circular shift is completed and register 120 is restored to its initial condition. This string is a dynamic string which is fully contained within the fault-capture circuit 26 (FIG. 1). The other strings are external to the fault-capture circuit and are threaded through various logic circuits using the lines designated 54a through 54d. The specific arrangement of external scan/set paths is dictated by maintenance considerations exclusive of fault-capture. Each logic circuit has a scan/set data-in line and a scan/set data-out line which are daisy-chained together and each logic circuit also has a string-select line which is activated by the string-select signals generated in scan/set control 100 but not shown in FIG. 2. For example, string-select line B would cause data to be circulated through the string comprised of logic circuits 126, 128, 130, while string-select line C would activate logic circuits 132 through 136. These strings may be either static or dynamic as required by the system. String D threads through both external logic circuits and internal registers of the fault-capture circuit 26. This string, after threading logic circuits 138, 140 and 142, then threads mask register 122 and capture register 124. This string may be of the static type in that mask register 122 and capture register 124 do not have to be accessed while the system clock is running.

Figure 3A:
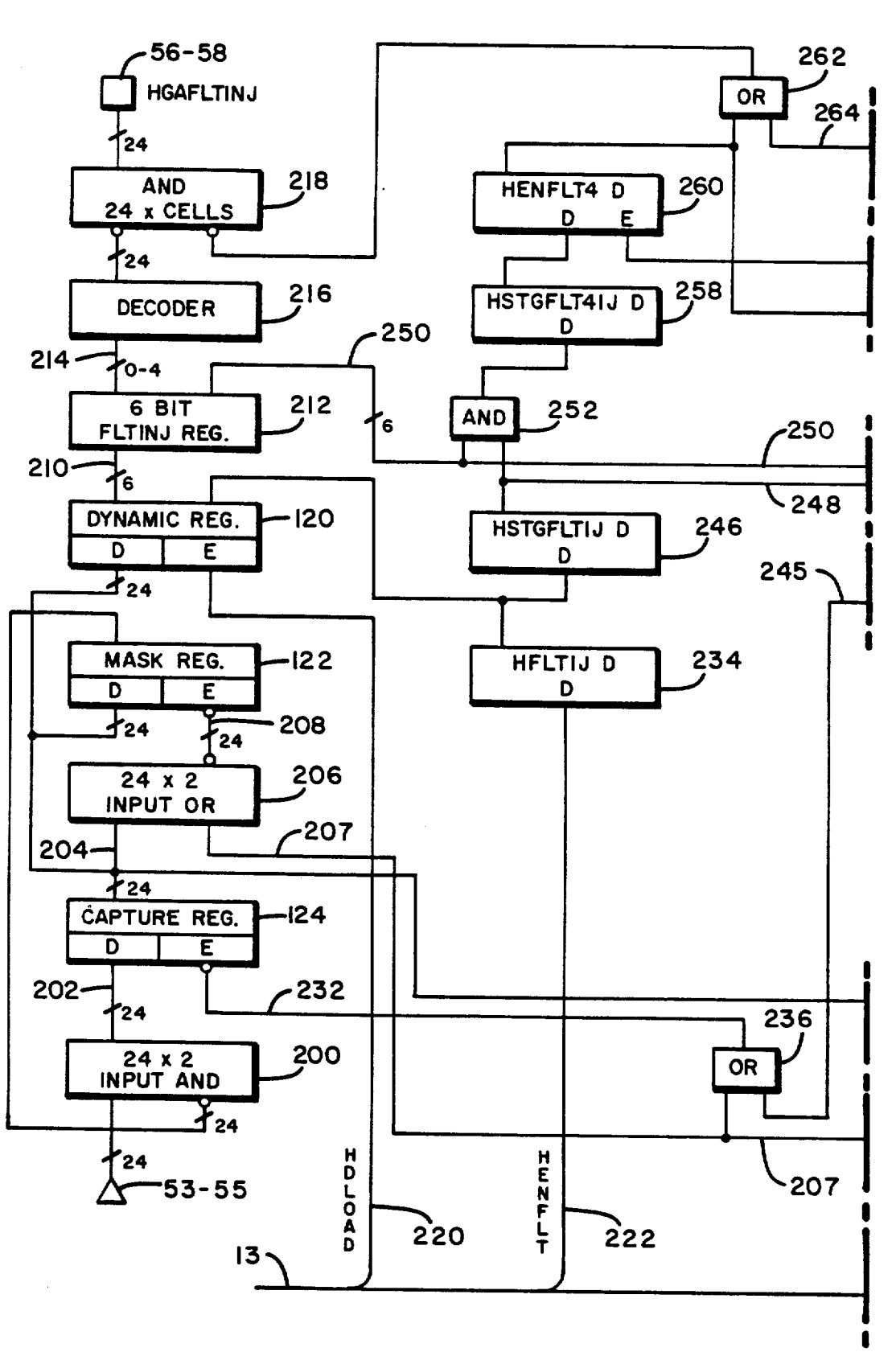
FIG. 3 comprised of FIGS. 3A and 3B, is a detailed block diagram of the fault-capture/fault-injection circuitry of the fault-capture circuit 26.
Figure 3B:
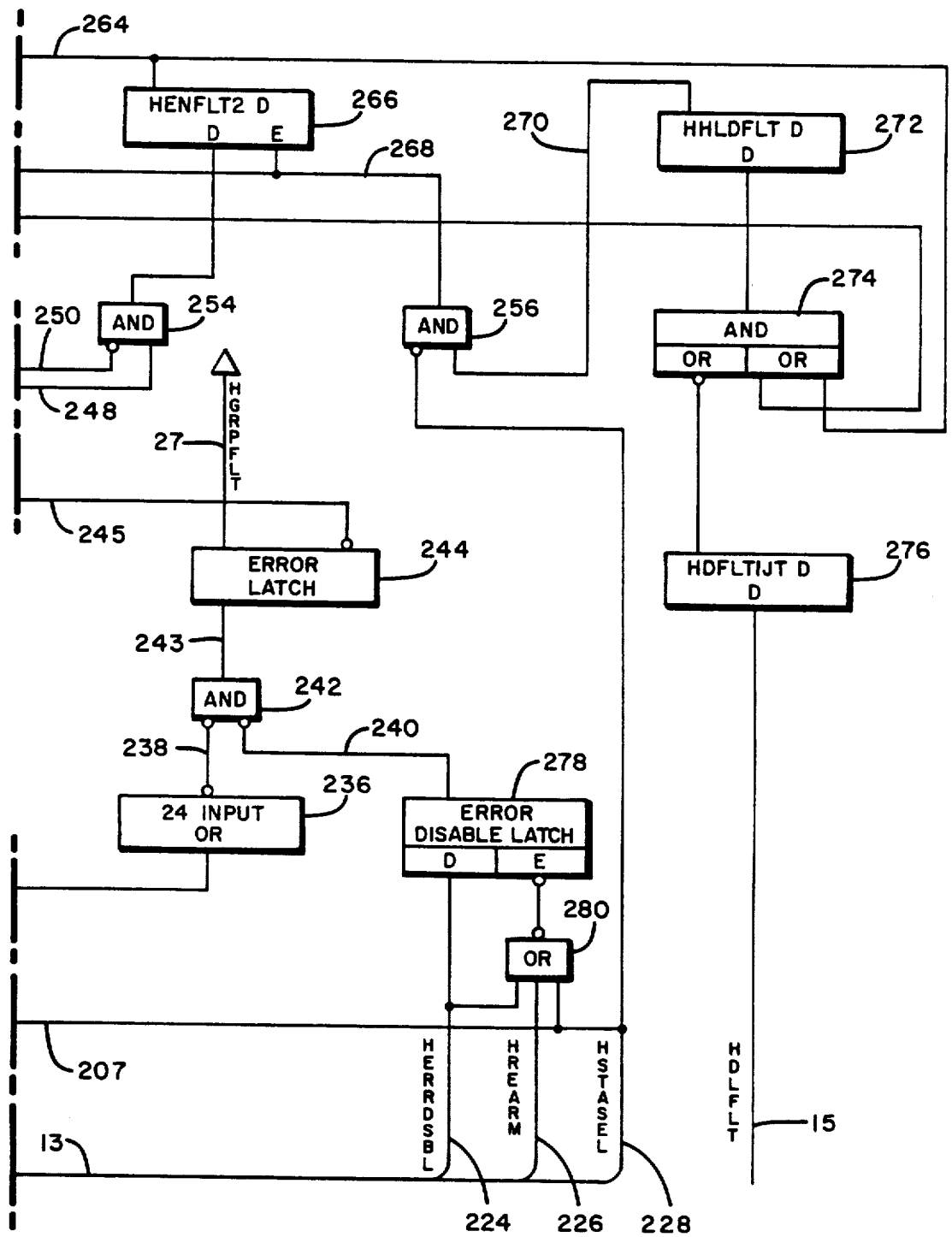

FIG. 3 shows a more detailed block diagram of the fault-capture and fault-injection circuitry of circuits 26 through 32. Lines 53 through 55 of FIG. 1 are indicative of 24 fault indication inputs. Logic array 200 is a set of 24 two-input AND circuits. Each AND circuit has a fault indication input and a corresponding input from mask register 122 (FIG. 2). Initially, mask register 122 is set to all zeros, such that any fault indication input will appear as a "1" on the respective D-input of the capture register 124. This register is a flow through register wherein the D-inputs flow through the Q-outputs during the time that the E-input 232 is low. Each of the 24 outputs of capture-register 124 is connected to one input of the 24 inputs of OR circuit 236. When a fault condition is sensed, the output of OR circuit 236 goes low to enable AND 242 and, thus, present a "1" to the D-input of error latch 244. This latch is clocked every machine cycle so that when a fault indication occurs in a given machine cycle, it is latched by the end of that cycle. This generates the group fault indication on line 27. The $\overline{Q}$ output 245 of error latch 244 propagates through OR 236 to raise the enable input of capture register 124, thus latching it into a state corresponding to the present inputs 202. Any subsequent fault indications will be temporarily ignored until this first fault indication has been processed. Logic array 206 is comprised of 24 two input OR circuits. One input of each OR circuit is connected to the respective output of capture register 204 while the other inputs are all connected to line 207. Initially, line 207 is low so that any bit set in capture register 124 causes an enable on the respective OR output 208 to latch the respective bit in mask register 122. The outputs of mask register 122 are connected to AND gate array 200 to perform the masking function.

The output of error latch 244 interrupts the maintenance controller in the manner previously described. When interrupted, it generates a HDLOAD signal on line 220, via control bus 13. This latches the present contents of capture register 124 into dynamic register 120. With the initial fault now captured, the maintenance controller next issues a HERRDSBL command on line 224, via data path 13, which sets error disable latch 278, thus inhibiting AND gate 242. On the next clock cycle, error latch 244 is thus cleared. Capture register 124 is again enabled, via OR gate 236. Any bit position which has a ONE in the mask register 122 will now force a ZERO into that bit position of capture register 124 via AND gate array 200. Thus the fault indication previously reported will be cleared in the capture register 124, but will remain in the mask register 122, and only new fault indications will flow through AND array 200 to the respective outputs of capture register 124. Next, the maintenance controller reads dynamic register 120, using the scan/set path in the manner previously described.

When the maintenance controller is again ready to accept interrupts, it issues a re-arm command (HREARM) on line 226 to clear the error disable latch 278 and the cycle is thus repeated. In a typical fault episode, there will be an initial fault indication followed by a series of error reports as corrupted data propagates through the system. Except in a highly improbable case in which two fault indications are generated on the same machine cycle, this arrangement will distinguish the initial fault indication from all other error reports. Each new fault indication will result in an interrupt to the maintenance controller and the accumulation of that fault indication in mask register 122. Since dynamic register 120 is part of a dynamic scan/set string, the system can continue running while the maintenance controller accumulates a time tagged history of fault indications. When a unit is removed, the unit clock is stopped to allow static scan set strings to be operated.

To assure that the fault-capture circuitry is itself operational, the maintenance controller can run diagnostic tests on the fault-checking circuitry by presetting values into dynamic register 120, via the static scan/set path. To inject a fault, dynamic register 120 is first loaded with six-bit code by the maintenance controller, via the scan/set path. Bits 0 through 4 define the routing of the fault-injection while bit 5 determines the clock phase that the fault will be injected. If bit 5 is a "0", faults would be injected on clock phase 1 or 2; while if bit 5 is a "1", faults would be injected on clock phase 3 or 4. Next, the maintenance controller issues a HENFLT signal on line 222 which causes latches 234 and 246 to be set. While injection register 212 is loaded with the 6-bit code from register 120, decoder 216 decodes bits 0 through 4 and partially enables one of the 25 AND gates of logic array 218. Depending on the state of bit 5 of register 212, either AND gate 252 or AND gate 254 will be enabled, thus a "1" will be present at the input of either D-input of latch 260 or latch 266. This provides an enable to inject a fault through the output of AND gate 218. When either latch 260 or 266 is set, the output of OR gate 262 goes low, completing the enable of one of the AND gates of array 218 and thus activating one of 24 fault-injection lines indicated in FIG. 1 as lines 56 through 58. The selected fault inject lien stays enabled until the maintenance controller issues a command to disable the fault inject on line 15 labelled as HDLFLT. When the line HDLFLT is activated, it sets latches 276 and 272 which, in turn, enables latches 260 and 266 in order to latch in inactive data from 258 and 254, respectively. This will turn off the enable of the selected fault at the output of gage 218. There are 24 physical outputs available at 56 through 58, each of which is connected to a gate array on the card. It should be noted that the number of fault injects is not constrained by the present embodiment. The injected fault is distributed to a designated gate array where it will cause the designated fault to be detected. Once the fault occurs, the gate array reports the fault back to the fault capture circuit labelled as 28 through 32 in FIG. 1. The lower level fault capture circuit then reports the fault to top level fault capture circuit labelled as 26.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to equipment details and operating procedures, can be accomplished without departing from the scope of the invention itself.

What is claimed is:

1. In a digital electronic system, apparatus for detecting and isolating faulty operation comprising, in combination:
   (a) fault indication means associated with a predetermined grouping of logic circuits for producing a fault signal indicative of a fault or error condition in said grouping of logic circuits;
   (b) fault capture means coupled to a plurality of fault indication means for providing a group fault output signal indicative that at least one of said fault indication means has produced said fault signal, said fault capture means including:
      (i) first register means for capturing said fault signals,
      (ii) error latch means set upon a first fault signal being captured in said first register means for producing said group fault output signal,
      (iii) logic means responsive to said grouping fault output signal for inhibiting capture of fault signals subsequent to said first fault signal,
      (iv) second register means for storing mask data, said mask data being the cumulative fault signals propagated to said first register means,
      (v) means for selectively inhibiting inputs to said first register means conditional upon the state of said second register means, and
      (vi) third register means connected to receive the contents of said first register means,
   (c) programmable controller means including
      (i) interrupt means coupled to receive said group fault signal,
      (ii) capture control means for
         (a) transferring the contents of said first register to said third register, and
         (b) resetting said error latch means,
      (iii) memory means for logging cumulative fault events occurring in said logic circuits, and
      (iv) data communication means for transferring data from said third register to said memory means.

2. The apparatus as in claim 1 wherein said data communication means includes scan/set string means including at least one dynamic string.

3. The apparatus as in claim 2 wherein said apparatus further includes fault injection means for verifying the operability of said fault capture means.

4. The apparatus as in claims 1, 2 or 3 wherein said apparatus includes a plurality of said fault capture means arranged in a hierarchical order.

* * * * *